United States Patent
Nagarajan et al.

(10) Patent No.: US 11,581,852 B2
(45) Date of Patent: *Feb. 14, 2023

(54) SYSTEMS AND METHODS FOR DETECTING LOCAL OSCILLATOR LEAKAGE AND IMAGE TONE IN I/Q MIXER BASED TRANSCEIVERS

(71) Applicant: Samsung Electronics Co., Ltd., Suwon-si (KR)

(72) Inventors: Hariharan Nagarajan, Sunnyvale, CA (US); Ashutosh Verma, Santa Clara, CA (US); Chung Lau, Sunnyvale, CA (US); Tienyu Chang, Sunnyvale, CA (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/511,434

(22) Filed: Oct. 26, 2021

(65) Prior Publication Data
US 2022/0052644 A1 Feb. 17, 2022

Related U.S. Application Data

(63) Continuation of application No. 17/142,058, filed on Jan. 5, 2021, now Pat. No. 11,171,609, which is a continuation of application No. 16/810,761, filed on Mar. 5, 2020, now Pat. No. 10,897,228.

(60) Provisional application No. 62/944,927, filed on Dec. 6, 2019.

(51) Int. Cl.
*H03D 1/04* (2006.01)
*H03D 1/06* (2006.01)
*H03D 1/18* (2006.01)
*H03D 7/14* (2006.01)
*H04B 1/403* (2015.01)
*H04B 17/10* (2015.01)

(52) U.S. Cl.
CPC .......... *H03D 7/1425* (2013.01); *H04B 1/406* (2013.01); *H04B 17/104* (2015.01); *H03D 2200/0045* (2013.01)

(58) Field of Classification Search
None
See application file for complete search history.

(56) References Cited

U.S. PATENT DOCUMENTS

| | | |
|---|---|---|
| 6,696,888 B2 | 2/2004 | Gilbert |
| 7,286,811 B2 | 10/2007 | Kral |
| 7,653,158 B2 | 1/2010 | Rawlins et al. |
| 7,657,241 B2 | 2/2010 | Shah |
| 7,949,306 B2 | 5/2011 | Shah |
| 8,014,719 B2 | 9/2011 | Moloudi et al. |
| 8,120,420 B2 | 2/2012 | Ito |
| 8,390,967 B2 | 3/2013 | Goto |
| 8,520,785 B2 | 8/2013 | He |

(Continued)

*Primary Examiner* — Kenneth B Wells
(74) *Attorney, Agent, or Firm* — Lewis Roca Rothgerber Christie LLP

(57) ABSTRACT

According to one embodiment, a transceiver includes: a radio transmitter including a power amplifier; a detector circuit including: a squaring circuit configured to receive an output of the power amplifier of the radio transmitter and configured to produce an output current; and a DC current absorber electrically connected to an output terminal of the squaring circuit.

20 Claims, 6 Drawing Sheets

(56) References Cited

U.S. PATENT DOCUMENTS

| | | |
|---|---|---|
| 8,559,488 B1 | 10/2013 | Smaini et al. |
| 8,624,657 B2 | 1/2014 | Beale et al. |
| 8,884,691 B2 | 11/2014 | Ito |
| 10,172,143 B2 | 1/2019 | Gebhard |
| 10,897,228 B1 | 1/2021 | Nagarajan et al. |
| 11,171,609 B2 * | 11/2021 | Nagarajan ............ H04B 17/104 |
| 2007/0086548 A1 | 4/2007 | Rawlins et al. |

* cited by examiner

SYSTEMS AND METHODS FOR DETECTING LOCAL OSCILLATOR LEAKAGE AND IMAGE TONE IN I/Q MIXER BASED TRANSCEIVERS

CROSS-REFERENCE TO RELATED APPLICATION(S)

This application is a continuation of U.S. patent application Ser. No. 17/142,058, filed Jan. 5, 2021, now U.S. Pat. No. 11,171,609, which is a continuation of U.S. patent application Ser. No. 16/810,761, filed Mar. 5, 2020, now U.S. Pat. No. 10,897,228, which claims priority to and the benefit of U.S. Provisional Patent Application No. 62/944,927, filed in the United States Patent and Trademark Office on Dec. 6, 2019, the entire content of each of which is hereby incorporated by reference.

FIELD

Aspects of embodiments of the present disclosure relate to radio frequency (RF) circuits, including systems and methods for detecting local oscillator leakage and image tone in I/Q mixer based transceivers.

BACKGROUND

A mixer is an electrical circuit that creates a new signal from two signals applied to the mixer. For example, two mixers (an in-phase (I) mixer and a quadrature (Q) mixer) that each receive a phase-locked local oscillator (LO) frequency that are 90 degrees apart—an in-phase (I) frequency and a quadrature (Q) frequency respectively—can be used to translate an input baseband signal (e.g., a low frequency signal) to a radio frequency (RF) signal (e.g., a high frequency signal). Generally, mixers can be considered as multiplying the two input signals together.

In radio frequency (RF) transceivers, mixers are generally used with the local oscillator (LO) to convert signals between baseband frequencies and the radio frequency at which the transceiver is tuned to operate. For example, in a transmit side of a radio frequency transceiver an analog baseband signal (e.g., in the range of 0 Hz to 20 MHz or more) may be mixed with a LO (e.g., a transmitter LO) to mix the frequency of the signal to radio transmission frequencies (e.g., in the case of 5G New Radio, 410 MHz to 7125 MHz and/or 24.25 GHz to 52.6 GHz). Similarly, in a receive side of a radio frequency transceiver, a received analog signal in the radio frequencies is mixed with the LO (e.g., a receiver LO) to recover a baseband signal.

SUMMARY

Aspects of embodiments of the present disclosure relate to systems and methods for detecting local oscillator leakage and image tone in I/Q mixer based transceivers.

According to one embodiment of the present disclosure, a local oscillator leakage and image tone detector circuit includes: a squaring circuit configured to receive an output of a power amplifier of a radio transmitter and configured to produce an output current, the output of the power amplifier including: a desired tone; a local oscillator leakage tone; and an image tone, and the output current of the squaring circuit including: a direct current (DC) component including a function of the desired tone; an alternating current (AC) component including: a function of the local oscillator leakage tone; and a function of the image tone; and a DC current absorber electrically connected to an output terminal of the squaring circuit, the DC current absorber being configured to filter out the DC component of the output current of the squaring circuit to produce a filtered output of the squaring circuit, the filtered output including the function of the local oscillator leakage tone and the function of the image tone.

The filtered output may be supplied to a transimpedance amplifier.

The radio transmitter may include a transmit mixer configured to mix an output of a transmitter local oscillator with an input baseband signal to produce a transmit mixer output, the transmit mixer output being supplied as input to the power amplifier, the squaring circuit may be configured to produce the output current at an output terminal connected to a radio receiver through a detector switch, the radio receiver may include: the transimpedance amplifier; and a receive mixer configured to mix a received signal with a receiver local oscillator, an output of the receive mixer being connected to the transimpedance amplifier through a receiver switch.

A radio transceiver including the radio transmitter and a radio receiver including the transimpedance amplifier; and the detector circuit may be included in an integrated circuit.

The detector circuit may further include: a receiver switch connected between a receive mixer of the radio receiver and the transimpedance amplifier, the receiver switch being configured to disconnect the radio receiver during calibration of the radio transceiver using the detector circuit; and a detector switch connected between the output terminal of the squaring circuit and the transimpedance amplifier, the detector switch being configured to connect the output terminal of the squaring circuit of the detector circuit to the transimpedance amplifier during calibration of the radio transceiver.

The radio transmitter may further include a transmit mixer configured to mix an output of a transmitter local oscillator with an input baseband signal to produce a mixer output, the mixer output being supplied to the power amplifier.

The local oscillator leakage tone may correspond to the output of the transmitter local oscillator.

A signal path of the transmit mixer may include an in-phase portion and a quadrature portion, and the image tone may correspond to an imbalance between the in-phase portion and the quadrature portion of the signal path.

The squaring circuit may include: a first transistor; and a second transistor having substantially identical transistor characteristics as the first transistor, the first transistor and the second transistor being connected in parallel between an output terminal of the squaring circuit and ground, the output of the squaring circuit may correspond to a sum of a first current flowing through the first transistor and a second current flowing through the second transistor in accordance with the output of the power amplifier, where the output of the power amplifier may be differentially supplied to a first gate electrode of the first transistor and a second gate electrode of the second transistor.

The DC current absorber may include a low-dropout regulator-based voltage follower.

The DC current absorber may include: an operational amplifier having a non-inverting input connected to the output terminal of the squaring circuit and an inverting input connected to a reference voltage source; a transistor connected between a power supply and the output terminal of the squaring circuit and having a gate electrode connected to an output of the operational amplifier; and a capacitor connected between the power supply and the gate electrode of the transistor.

An output impedance of the DC current absorber may be frequency dependent and has a low output impedance at frequencies below a desired cutoff frequency and a high output impedance otherwise.

According to one embodiment, a method for detecting local oscillator leakage and image tone includes: supplying an output of a power amplifier of a radio transmitter of a radio transceiver to a squaring circuit of a detector circuit to generate an output current, the output of the power amplifier including: a desired tone; a local oscillator leakage tone; and an image tone; the output current of the squaring circuit including: a direct current (DC) component including a function of the desired tone; and an alternating current (AC) component including: a function of the local oscillator leakage tone; and a function of the image tone; absorbing, by a DC current absorber of the detector circuit, the DC component of the output current to produce a filtered output of the squaring circuit, wherein the filtered output includes the function of the local oscillator leakage tone and the function of the image tone; and detecting the local oscillator leakage tone and the image tone based on the filtered output.

The method may further include supplying the filtered output to a transimpedance amplifier.

The transimpedance amplifier may be a component of a radio receiver of the radio transceiver.

The radio receiver may further include a receive mixer configured to mix a received signal with a receiver local oscillator, an output of the receive mixer being connected to the transimpedance amplifier through a receiver switch, the detector circuit may include an output terminal configured to supply the filtered output to the transimpedance amplifier through a detector switch, and the method may further include, while detecting local oscillator leakage and image tone of the radio transceiver: connecting, by the detector switch, the output terminal of the detector circuit to the transimpedance amplifier; and disconnecting, by the receiver switch, the receive mixer from the transimpedance amplifier.

The method may further include: mixing, by a transmit mixer of the radio transmitter of the radio transceiver, an input baseband signal with an output of a transmitter local oscillator of the radio transmitter to generate a mixer output; and amplifying, by the power amplifier of the radio transmitter, the mixer output to produce the output of the power amplifier.

The local oscillator leakage tone may correspond to the output of the transmitter local oscillator.

A signal path of the transmit mixer may include an in-phase portion and a quadrature portion, and the image tone may correspond to an imbalance between the in-phase portion and the quadrature portion of the signal path.

The squaring circuit may include: a first transistor; and a second transistor having substantially identical transistor characteristics as the first transistor, the first transistor and the second transistor being connected in parallel between an output terminal of the squaring circuit and ground, wherein the output of the squaring circuit may correspond to a sum of a first current flowing through the first transistor and a second current flowing through the second transistor in accordance with the output of the power amplifier, where the output of the power amplifier may be differentially supplied to a first gate electrode of the first transistor and a second gate electrode of the second transistor.

BRIEF DESCRIPTION OF THE DRAWINGS

The accompanying drawings, together with the specification, illustrate exemplary embodiments of the present disclosure, and, together with the description, serve to explain the principles of the present disclosure.

DETAILED DESCRIPTION

Figure 1:
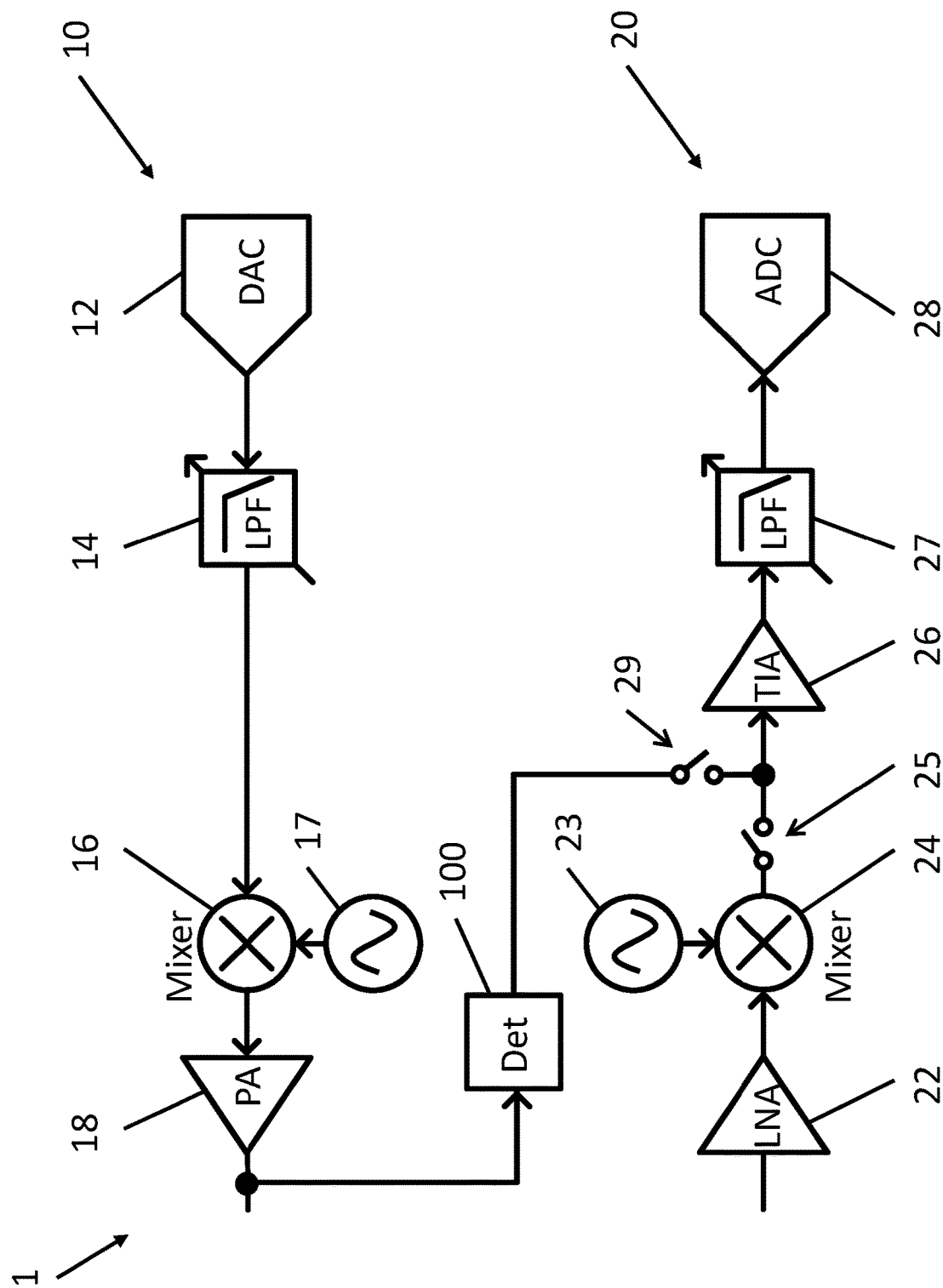
FIG. 1 is a block diagram of a transceiver including a detector, according to one embodiment of the present disclosure.

In the following detailed description, only certain exemplary embodiments of the present disclosure are shown and described, by way of illustration. As those skilled in the art would recognize, embodiments of the present disclosure may be embodied in many different forms and should not be construed as being limited to the embodiments set forth herein. Like reference numerals designate like elements throughout the specification.

Radio frequency (RF) transceivers are widely used in electronic communications and can be found in a wide range of consumer devices such as smartphones (e.g., for communicating with cellular towers), laptop computers (e.g., for communicating with wireless local area network base stations), and personal accessories (e.g., for connecting with Bluetooth hosts). Accordingly, there is a desire for high performance and efficient RF transceivers for use in both consumer and enterprise electronic wireless communications.

FIG. 1 is a block diagram of a transceiver including a detector, according to one embodiment of the present disclosure. Referring to FIG. 1, a radio frequency (RF) transceiver (or radio transceiver) 1 may include a radio transmitter (or transmitter or transmit side) 10 configured to modulate baseband signals for transmission. For example, the transmit side may receive a digital representation of an input baseband waveform at a digital-to-analog converter (DAC) 12, where, for example in the case of a smartphone, the baseband waveform may encode digital voice data, network data (e.g., Internet traffic), and the like. In some embodiments, the digital representation of the waveform may be the output of, for example, a software defined radio (SDR) or other digital signal processing hardware (referred to herein as a "modem"). The DAC 12 converts the digital data into a corresponding analog baseband signal, which is then supplied to a low pass filter 14 (e.g., to suppress harmonics generated by the DAC 12) before being supplied to a transmit mixer 16. The transmit mixer 16 mixes the supplied baseband signal with a transmitter local oscillator (LO) 17 having a first local oscillator frequency $f_{LO_1}$ to convert the signal from a baseband frequency $f_{BB}$ (e.g., in a range of 0 Hz to 200 MHz or more) to a radio frequency $f_{RF}$ for transmission, where the particular frequency may depend on the frequency bands specified by protocol (e.g., in the case of 5G New Radio, 410 MHz to 7.125 GHz and/or 24.25 GHz to 52.6 GHz) and as tuned by the transceiver (e.g., through the selection of particular channels for operation). The output of the transmit mixer 16 (the mixer output) is then supplied to one or more amplification stages, depicted in FIG. 1 as power amplifier (PA) 18, and an amplified signal is supplied to one or more antennas for transmission.

The RF transceiver 1 shown in FIG. 1 also includes a receive side (or receiver or radio receiver) 20 configured to demodulate received signals to baseband signals for further processing. The radio receiver 20 of the RF transceiver 1 may receive a radio frequency signal (e.g., from an antenna) and may supply the received signal to a low-noise amplifier (LNA) 22. The amplified signal is then supplied to a receive mixer 24, which mixes the received and amplified signal with a receiver local oscillator (LO) 23 having a second local oscillator frequency $f_{LO2}$ to reduce the signal from radio frequency $f_{RF}$ to baseband frequency $f_{BB}$. This receiver local oscillator 23 may be the same local oscillator as the transmitter local oscillator 17 used with the transmit mixer 16 (e.g., in the case of time division multiplexing), or may be a different local oscillator (e.g., so that the transceiver 1 can concurrently transmit and receive on different frequencies using frequency division multiplexing). The baseband frequency signal may then be supplied to a transimpedance amplifier (TIA) 26, which amplifies the baseband frequency signal and outputs the amplified signal to a low-pass filter (LPF) 27 (e.g., a biquad or biquadratic filter). The filtered signal is then supplied to an analog-to-digital converter (ADC) 28, which converts the analog signal to a digital representation thereof for further processing (e.g., by a modem, as discussed above).

The receiver may further include a receiver switch 25 to disconnect the radio receiver 20. For example, the receiver switch 25 is shown in FIG. 1 as being between the output of the receive mixer 24 and the input of the transimpedance amplifier 26. (However, embodiments of the present disclosure are not limited thereto.) Generally, the receiver switch 25 may be used to disconnect the radio receiver 20 of the transceiver while a calibration is being performed by a detector circuit 100, as described in more detail below.

Figure 2B:
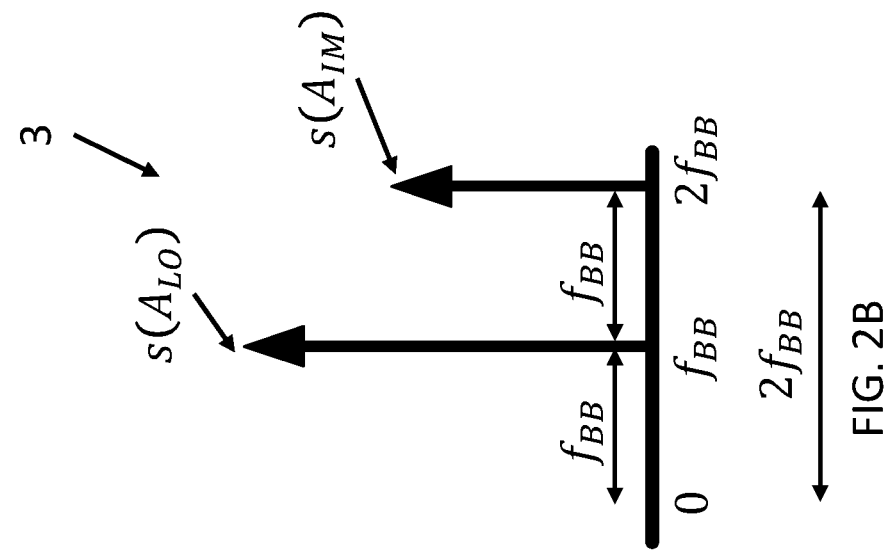
FIG. 2B is a graph schematically depicting a power spectrum or amplitude spectrum of a detected function or signature of LO leakage and a detected function or signature of image tone in accordance with one embodiment of the present disclosure.
Figure 2A:
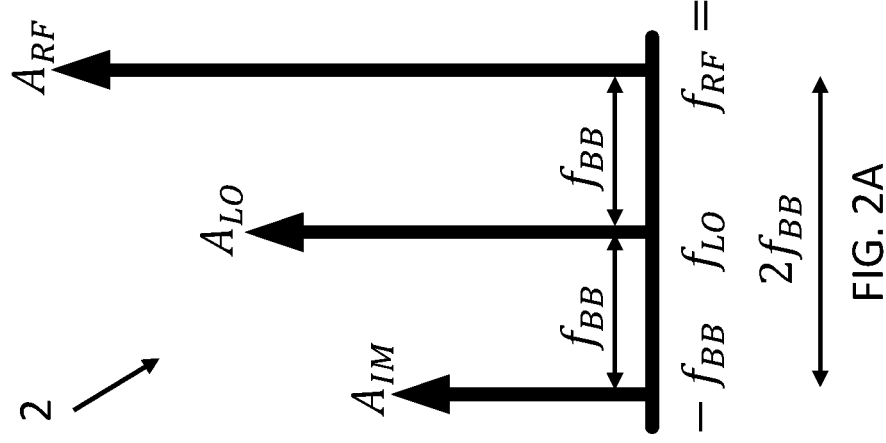
FIG. 2A is a graph schematically depicting local oscillator (LO) leakage and image tone appearing in a power spectrum or amplitude spectrum of the output of a power amplifier.

FIG. 2A is a graph schematically depicting local oscillator (LO) leakage and image tone appearing in a power spectrum or amplitude spectrum of the output of a power amplifier. More specifically, FIG. 2A is a graph schematically depicting a power spectrum or amplitude spectrum of an output signal 2 of the power amplifier 18. As noted in the background, two in-phase/quadrature (I/Q) mixers, that each receive a phase-locked local oscillator (LO) frequency that are 90 degrees apart, translate a radio frequency (RF) to an in-phase (I) frequency and a quadrature (Q) frequency, respectively. For example, the transmit mixer 16 and the receive mixer 24 may each include in-phase (I) and quadrature (Q) signal paths. I/Q imbalance or I/Q mismatch may occur due to mismatches in the phase of the in-phase and quadrature portions of the signal paths (e.g., when the two signal paths are not exactly 90 degrees apart). For the sake of convenience, in the following discussion, the first local oscillator frequency $f_{LO1}$ that is generated by the transmitter local oscillator 17 and that is mixed with the baseband signal by the transmit mixer 16 may be referred to as the local oscillator frequency $f_{LO}$, whereas the second local oscillator frequency $f_{LO2}$ that is generated by the receiver local oscillator 23 and mixed with the received and amplified signal by the receive mixer 24 will be consistently referred to herein as the second local oscillator frequency $f_{LO2}$.

As shown in FIG. 2A, the output of the power amplifier may include significant signals at three different frequencies. One signal is a desired tone $A_{RF}$ at the radio frequency $f_{RF}$, corresponding to the desired output of the radio transmitter 10. In accordance with standard mixer operations, the desired tone is at a radio frequency $f_{RF}$ equal to the sum of the local oscillator frequency $f_{LO}$ (in the embodiment shown in FIG. 2A, the first local oscillator frequency $f_{LO1}$) and the baseband frequency $f_{BB}$ ($f_{RF}$ $f_{LO}+f_{BB}$). However, I/Q mismatch may cause the output of the power amplifier to also include an image tone $A_{IM}$ at the image tone frequency $f_{IM}$ (where $f_{IM}=f_{LO}-f_{BB}$). Furthermore, local oscillator (LO) leakage may also cause the signal output by the transmitter local oscillator 17 to appear in the output as $A_{LO}$ at the local oscillator frequency $f_{LO}$ (the first local oscillator frequency $f_{LO1}$). Accordingly, the desired tone $A_{RF}$ is $f_{BB}$ above the local oscillator frequency $f_{LO}$, and, likewise, the image tone $A_{IM}$ is $f_{BB}$ below the local oscillator frequency $f_{LO}$, such that the image tone $A_{IM}$ and the desired tone $A_{RF}$ are $2f_{BB}$ apart in frequency. The I/Q mismatch may differ for different frequencies (e.g., for different baseband frequencies and for different local oscillator frequencies). As one concrete example, the baseband frequency $f_{BB}$ may be 200 MHz, the local oscillator frequency $f_{LO}$ may be 10 GHz, and therefore the radio frequency of the desired tone $f_{RF}$ may be 10 GHz+200 MHz=10.2 GHz, and the image tone frequency $f_{IM}$ may be 10 GHz-200 MHz=9.8 GHz.

Accordingly, aspects of embodiments of the present disclosure relate to systems and methods to detect the local oscillator leakage signal $A_{LO}$ (e.g., corresponding to the first local oscillator frequency mixed by the transmit mixer 17 with the input baseband signal to be transmitted) and the image tone $A_{IM}$ in order to calibrate the transceiver 1 to reduce or remove the local oscillator leakage $A_{LO}$ and the image tone $A_{IM}$ due to the I/Q imbalance across the frequency ranges of operation. Embodiments of the present disclosure may be used with a variety of different types of radio transceivers operating in various modes, including radio transceivers implementing time division duplex (TDD) and/or frequency division duplex (FDD) modes of operation. The detection of the local oscillator leakage signal and the image tone may be performed as part of a calibration process, where the calibration may be a factory calibration, a real-time calibration, a background calibration, and/or foreground calibration.

Referring to FIG. 1, according to some embodiments of the present disclosure, a detector circuit 100 is electrically connected between the output of the amplifier 18 of the radio transmitter 10 and the input of the transimpedance amplifier 26 of the radio receiver 20 in order to provide a loopback circuit that provides information to the modem for calibrating, for example, the in-phase and quadrature portions of the mixers. A detector switch 29 may further connect the output of the detector circuit 100 to the transimpedance amplifier 26, to connect the detector circuit 100 to the transimpedance amplifier 26 only when calibration measurements are being made (e.g., while the receiver switch 25 is open and transceiver 1 is not receiving signals captured from the antenna). While comparative systems include on-chip calibration capabilities, embodiments of the present disclosure provide effective detection circuits that are low power and low area, at least in part because portions of the radio receiver 20 are reused for the purpose of providing the feedback information through the detector circuit 100 and because detector circuits 100 according to embodiments of the present disclosure are comparatively simple and have relatively few components that are relatively small. According to some embodiments of the present disclosure, a same (or single) integrated circuit (IC) includes the detector circuit 100 and one or more components of the radio transmitter 10 and the radio receiver 20 of the transceiver 1 (e.g., a mixed-signal integrated circuit or an analog radio frequency integrated circuit, where the DAC 12 and the ADC 28 may be included or excluded from the integrated circuit).

FIG. 2B is a graph schematically depicting a power spectrum or amplitude spectrum of a detected function or signature of LO leakage and a detected function or signature of image tone in accordance with one embodiment of the present disclosure. As shown in FIG. 2B, the detector circuit 100 may be configured to assist in producing a detector signal 3 that includes a function or signature of the local oscillator leakage (e.g., leakage of the transmitter local oscillator 17) at a first frequency $f_{BB}$ and a function or signature of the image tone at a second frequency $2f_{BB}$. The generated detector signal 3 may then be supplied to the modem so that the modem can tune the transceiver 1 to reduce or remove the I/Q imbalance. Systems and methods by which detector circuits 100 according to embodiments of the present disclosure generate the detector signals 3 are described in more detail below.

Figure 3:
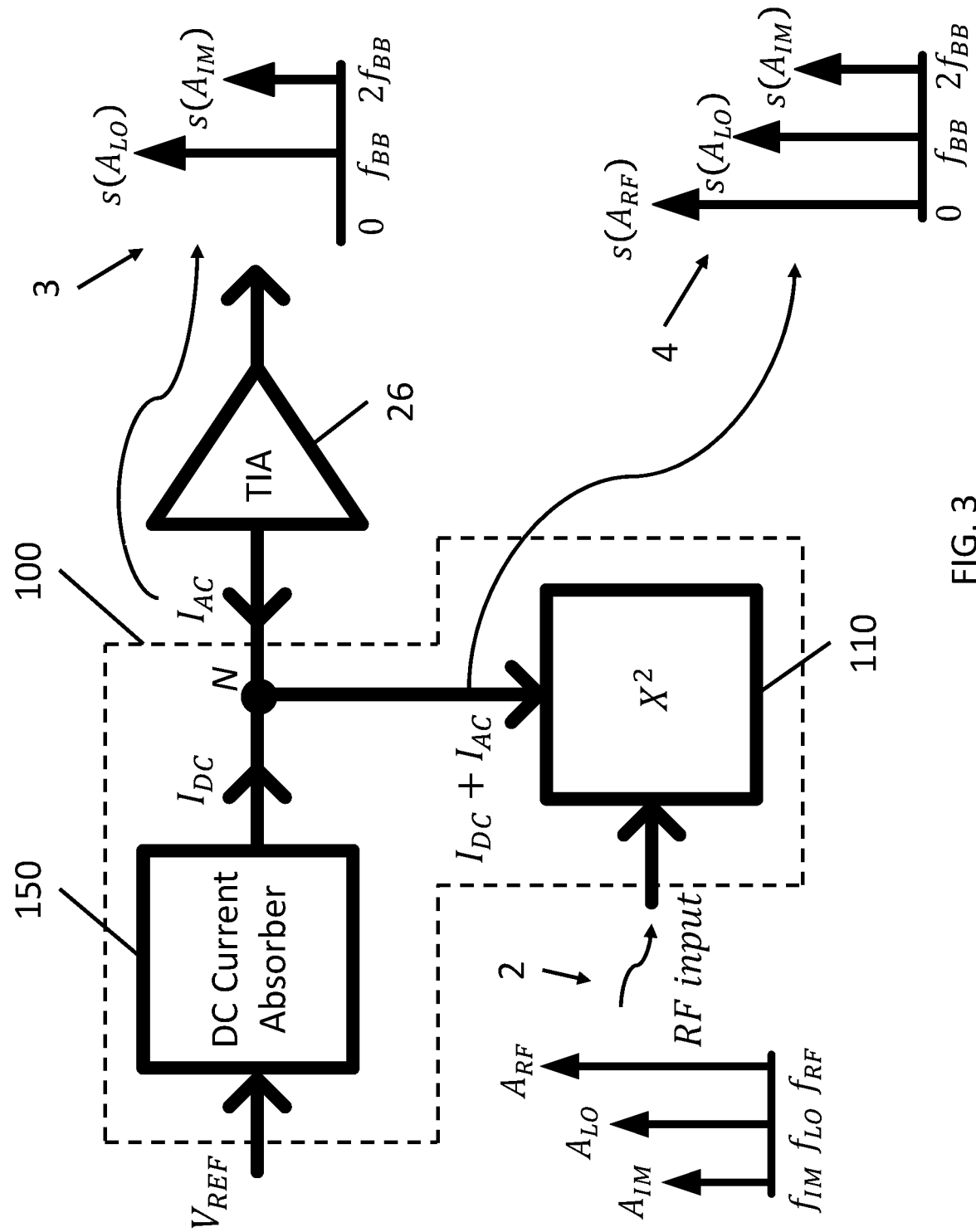
FIG. 3 is a schematic block diagram of a detector, according to one embodiment of the present disclosure.

FIG. 3 is a schematic block diagram of a detector, according to one embodiment of the present disclosure. In the embodiment shown in FIG. 3, the detector circuit 100 includes a squarer or squaring circuit ($X^2$) 110 and a voltage follower or DC current absorber 150. (For the sake of convenience and clarity, the detector switch 29 is omitted from FIG. 3, but may otherwise be located between the transimpedance amplifier 26 and a node N between the squaring circuit 110 and the DC current absorber 150.) The squaring circuit 110 receives the output signal 2 from the power amplifier 18 as input (e.g., as shown in FIG. 1 as the input to the detector circuit 100) and outputs a current signal corresponding to the square of the input signal (e.g., the input signal multiplied by itself). The current output of the squaring circuit 110 will be denoted herein as $I_{DC}+I_{AC}$.

As shown in FIG. 3, the input signal 2 to the detector includes a desired tone at radio frequency $f_{RF}$ with amplitude $A_{RF}$, a local oscillator tone at the local oscillator frequency $f_{LO}$ (or the first local oscillator frequency $f_{LO1}$) with amplitude $A_{LO}$, and an image tone at image frequency $f_{IM}$ with amplitude $A_{IM}$, and therefore the input signal 2 may be considered as the sum of the three tones:

$$A_{RF}f_{RF} + A_{LO}f_{LO} + A_{IM}f_{IM}.$$

When the squaring circuit 110 squares the input signal 2, it produces an output current $I_{DC}+I_{AC}$ having a magnitude corresponding to the square of the inputs:

$$(A_{RF}f_{RF} + A_{LO}f_{LO} + A_{IM}f_{IM})^2.$$

The squared signal expression may be expanded as follows (after factoring out a 2):

$$\frac{A_{RF}^2 f_{RF}^2}{2} + \frac{A_{LO}^2 f_{LO}^2}{2} + \frac{A_{IM}^2 f_{IM}^2}{2} + A_{RF}A_{LO}(f_{RF}-f_{LO}) + A_{LO}A_{IM}(f_{LO}-f_{IM}) + A_{RF}A_{IM}(f_{RF}-f_{IM})$$

In accordance with mixer mathematics, when a signal is multiplied by itself, its product includes a component with a frequency of zero (e.g., becomes a direct current or DC component and a component at twice the frequency of the input signal. Accordingly, the first term $$\frac{A_{RF}^2 f_{RF}^2}{2} + \frac{A_{LO}^2 f_{LO}^2}{2} + \frac{A_{IM}^2 f_{IM}^2}{2}$$

may be rewritten as:

$$\frac{A_{RF}^2}{2} + \frac{A_{LO}^2}{2} + \frac{A_{IM}^2}{2}$$

and, therefore, as shown in FIG. 3, a function or signature $s(A_{RF})$ of the power of the desired tone appears at the output 4 of the squaring circuit 110 as a DC component. (The component at twice the frequency of the signal is out of the operating band of the circuit and one of skill in the art would understand that the component at twice the frequency can be disregarded.)

As discussed above, the frequency of the desired tone $f_{RF}$ is $f_{BB}$ above the local oscillator frequency $f_{LO}$, so $f_{RF}=f_{LO}+f_{BB}$. Similarly, the frequency of the image tone $f_{IM}$ is $f_{BB}$ below the local oscillator frequency $f_{LO}$, so $f_{IM}=f_{LO}-f_{BB}$. Accordingly, the second term $A_{RF}A_{LO}(f_{RF}-f_{LO})+A_{LO}A_{IM}(f_{LO}-f_{IM})$ may be rewritten as:

$$A_{RF}A_{LO}(f_{LO}+f_{BB}-f_{LO})+A_{LO}A_{IM}(f_{LO}-f_{LO}+f_{BB})$$

which is equal to:

$$A_{RF}A_{LO}f_{BB}+A_{LO}A_{IM}f_{BB}$$

which can be simplified as:

$$(A_{RF}A_{LO}+A_{LO}A_{IM})f_{BB}$$

and, therefore, as shown in FIG. 3, a function or signature $s(A_{LO})$ of the local oscillator leakage (or leakage of the transmitter local oscillator) appears at the output 4 of the squaring circuit 110 as a signal having amplitude $s(A_{LO})$ $A_{RF}A_{LO}+A_{LO}A_{IM}$ at the baseband frequency $f_{BB}$.

The third term $A_{RF}A_{IM}(f_{RF}-f_{IM})$ of the above expression of the output of the squaring circuit 110 may also be simplified in the manner discussed above:

$$A_{RF}A_{IM}(f_{LO}+f_{BB}-(f_{LO}-f_{BB}))=A_{RF}A_{IM}(f_{LO}+f_{BB}-f_{LO}+f_{BB})=A_{RF}A_{IM}2f_{BB}$$

and, therefore, a function or signature $s(A_{IM})$ of the image tone appears at the output 4 of the squaring circuit 110 as a signal having amplitude $s(A_{IM})$ $A_{RF}A_{IM}$ at frequency $2f_{BB}$. As such, the output $I_{DC}+I_{AC}$ 4 of the squaring circuit 110 has a power spectrum with peaks at DC, $f_{BB}$, and $2f_{BB}$, as shown in FIG. 3. The DC component $I_{DC}$ of the squaring circuit 110 output may have amplitude:

$$\frac{A_{RF}^2}{2} + \frac{A_{LO}^2}{2} + \frac{A_{IM}^2}{2}$$

and the AC component $I_{AC}$ of the squaring circuit 110 output may have amplitude:

$$(A_{RF}A_{LO}+A_{LO}A_{IM})f_{BB}+A_{RF}A_{IM}2f_{BB}.$$

Generally, the function or signature of the desired tone power $s(A_{RF})$ has a significantly larger amplitude than the amplitude of the function or signature of the local oscillator leakage $s(A_{LO})$ and amplitude of the function or signature of the image tone $s(A_{IM})$. Supplying the output of the squaring circuit 110 directly to the transimpedance amplifier 26 would cause a few issues that prevent the functions or signatures of the local oscillator leakage and the image tone from being detected. One issue is that the large DC component $I_{DC}$ would saturate the transimpedance amplifier 26. Another issue is that the voltage at the node N will change based on the input power of the RF signal, which may cause the bias voltage at node N to be outside of an operating voltage range for the designed operation of the squaring circuit 110 and the transimpedance amplifier 26. A third issue is that high operating powers may result in non-linear operation of the circuit. As such, aspects of embodiments of the present disclosure relate to filtering out the DC component $I_{DC}$ of the output 4 of the squaring circuit 110 to produce a filtered output, where the filtered output substantially contains only the AC component $I_{AC}$ of the output of the squaring circuit 110. The AC component $I_{AC}$ of the output of the squaring circuit 110, which includes representations of the local oscillator leakage $s(A_{LO})$ and the image tone $s(A_{IM})$, are supplied to the transimpedance amplifier 26.

One comparative approach to filtering out the DC component $I_{DC}$ of the output 4 of the squaring circuit 110 would be to include a DC blocking capacitor between the output of the squaring circuit and the input to the transimpedance amplifier 26, with a biasing circuit (e.g., a biasing resistor or a diode-connected PMOS transistor) coupled between a voltage source VDD and the squaring circuit 110. However, in order for a DC blocking capacitor to block DC signals when working with baseband frequency $f_{BB}$ of, for example, 1 MHz to 400 MHz, such a DC blocking capacitor would need to be tremendously large, to the point where an impractical area of the integrated circuit would need to be used or an off-chip capacitor would need to be used (thereby requiring the use of one of the limited number of pins of the chip), both of which would substantially increase the cost of manufacturing such devices. Furthermore, the signature of the RF power changes the bias point of the node between the DC blocking capacitor, the biasing scheme, and the squaring circuit 110, so that the output of the squaring circuit 110 becomes non-linear.

Another comparative approach to filtering out the DC component $I_{DC}$ of the output 4 of the squaring circuit 110 would be to include a DC bypass inductor between the power source VDD and the squaring circuit 110. However, as with the DC blocking capacitor approach discussed above, a DC bypass inductor that would be capable of handling baseband frequencies in the range of 1 MHz to 400 MHz would require an extremely large inductor which would similarly require going off-chip. Accordingly, the use of a DC bypass inductor greatly increases the cost of manufacture.

Figure 4:
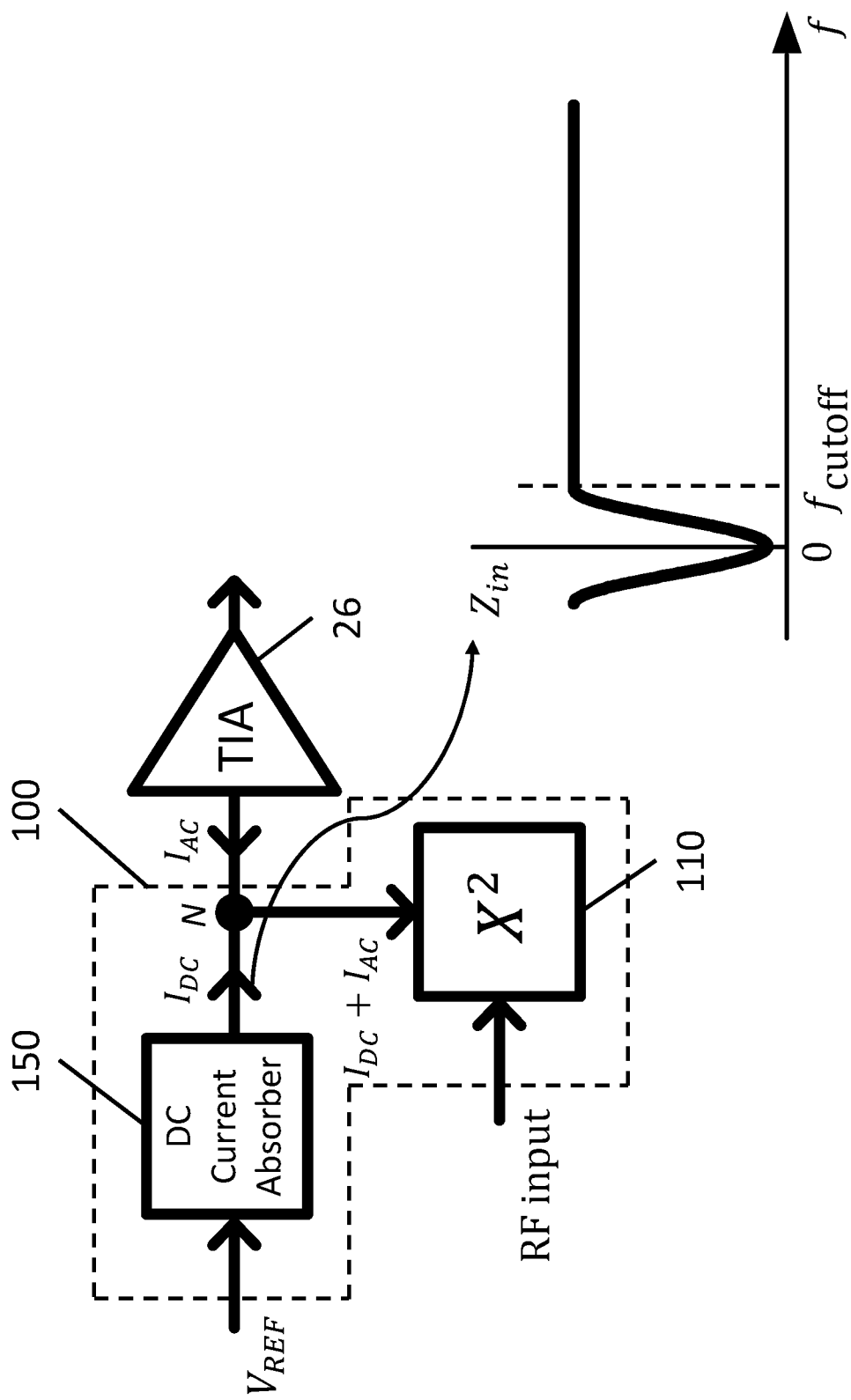
FIG. 4 is a graph schematically depicting a frequency dependent input impedance of a detector, according to one embodiment of the present disclosure.

Therefore, as shown in FIG. 3, according to some embodiments of the present disclosure the detector circuit 100 includes a DC current absorber or voltage follower 150, which provides a low impedance current path to absorb the DC component $I_{DC}$ of the output 4 of the squaring circuit 110 output by the squaring circuit 110. In more detail, the DC current absorber 150 presents very low output impedance at DC, but high impedance at AC signals. FIG. 4 is a graph schematically depicting a frequency dependent output impedance of a voltage follower of a detector, according to one embodiment of the present disclosure. As shown in FIG. 4, in some embodiments, the DC current absorber 150 presents very low output impedance (e.g., about 1.5Ω) at low signal frequencies below a desired cutoff frequency $f_{cutoff}$ (e.g., less than 700 Hz (0.7 kHz), such as 100 Hz). In some embodiments, the DC current absorber 150 presents high impedance (e.g., about 50 kΩ) at signal frequencies above the desired cutoff frequency $f_{cutoff}$. The DC current absorber 150 also sets a DC level at the input of the transimpedance amplifier 26, which is a differential amplifier (e.g., setting the input voltage of the transimpedance amplifier 26 at node N at the reference voltage $V_{REF}$ as supplied as input to the DC current absorber 150).

Accordingly, the inclusion of a DC current absorber 150 in the detector circuit 100 as shown, for example, in FIGS. 3 and 4 causes only the AC signals $I_{AC}$ of the output 4 of the squaring circuit 110 to be supplied as input to the transimpedance amplifier 26. As a result, the DC component of the output 4 of the squaring circuit 110, which represents the power amplifier power of the desired radio frequency signal, does not cause the issues discussed above, thereby allowing detection of the functions or signatures of the local oscillator leakage $s(A_{LO})$ and the image tone $s(A_{IM})$, which can then be supplied to the modem for calibration (e.g., in the digital domain). For example, the DC current absorber 150 in various embodiments may prevent saturation of the transimpedance amplifier 26, maintain a stable bias voltage at node N, and draw the majority of the power at node N to keep the circuit within a linear operating range.

Figure 5:
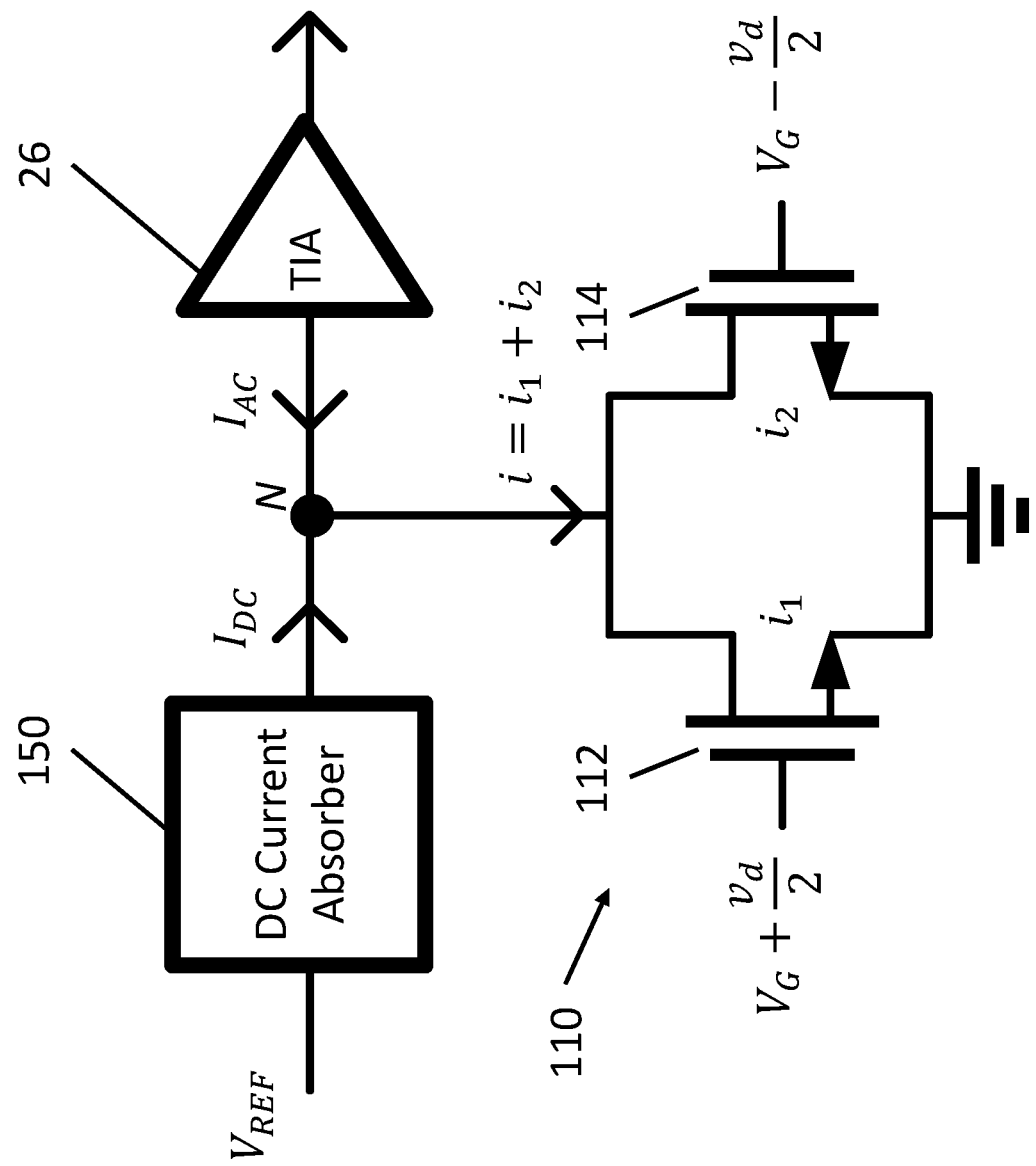
FIG. 5 is a circuit diagram illustrating a squaring circuit, according to one embodiment of the present disclosure.

FIG. 5 is a circuit diagram illustrating a squaring circuit, according to one embodiment of the present disclosure. As shown in FIG. 5, in one embodiment, the squaring circuit 110 includes first and second NMOS transistors 112 and 114 that have substantially identical transistor characteristics, where the source of each transistor is connected to ground and the drain of each transistor is connected to node N. The two transistors are driven in the saturation region in accordance with bias voltage $V_G$. The input signal 2 from the power amplifier 18 is denoted herein as voltage $v_d$, and is applied differentially to the gate electrodes of the first NMOS transistor 112 and the second NMOS transistor 114. More specifically, the sum of the bias voltage $V_G$ and half of the input signal 2 ($v_d/2$) is supplied to the gate of the first NMOS transistor 112 ($V_G+v_d/2$), and the difference of the bias voltage $V_G$ and half of the input signal 2 ($v_d/2$) is supplied to the gate of the second NMOS transistor 114 ($V_G-v_d/2$).

The drain currents $i_1$ and $i_2$ flowing from the drain to the source of respective transistors 112 and 114 is a square law function of the gate-source voltage ($V_{GS}$) of the transistors. By summing the currents $i_1$ and $i_2$ linear components (e.g., due to $V_G$) are cancelled out, but second order components add to produce a signal that includes second harmonics, which include mixing products and powers. As a result, the output current i of the squaring circuit 110 includes a square of the input signal $v_d$.

Figure 6:
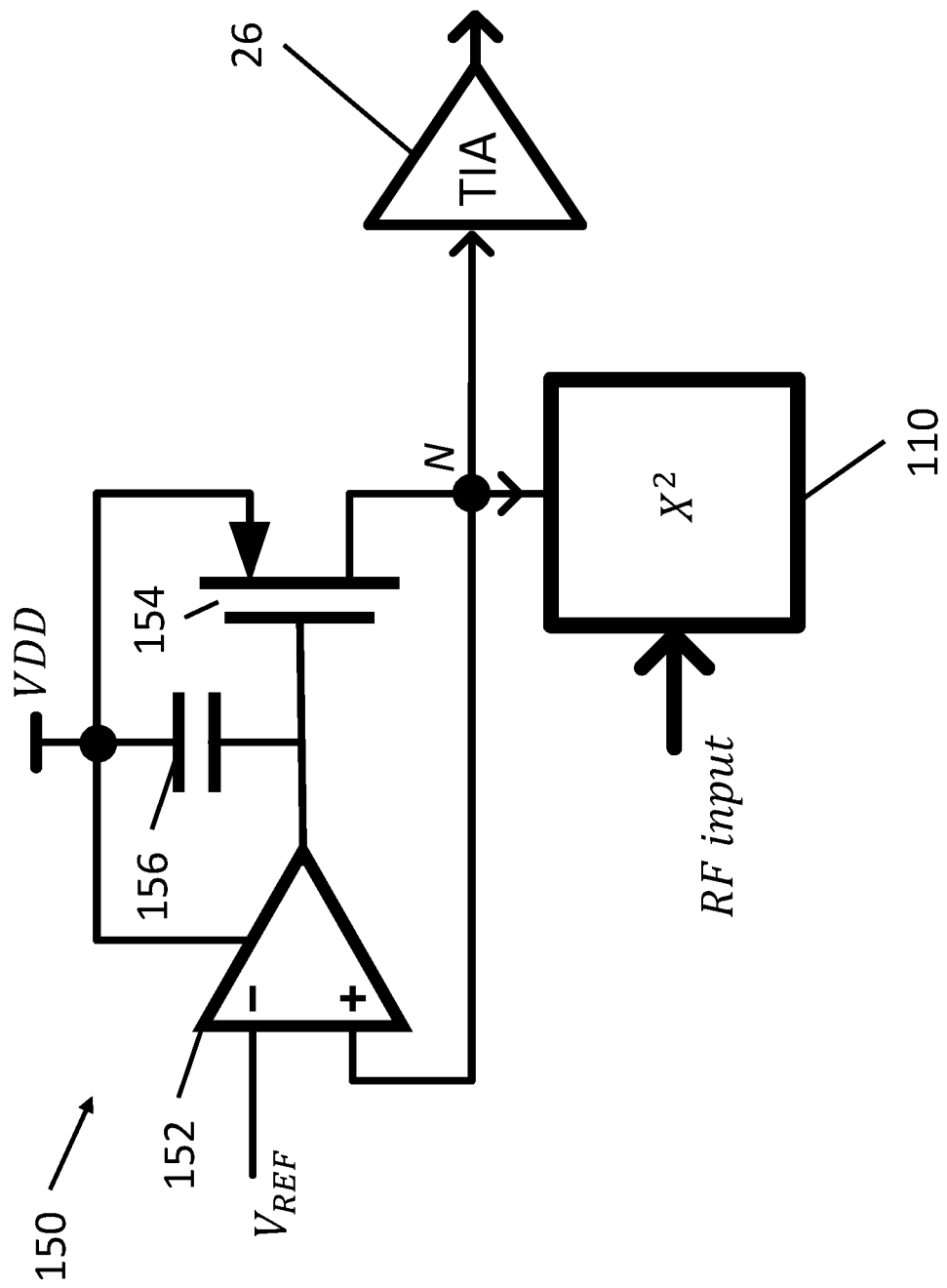
FIG. 6 is a circuit diagram illustrating a DC current absorber, according to one embodiment of the present disclosure.

FIG. 6 is a circuit diagram illustrating a DC current absorber, according to one embodiment of the present disclosure. In the embodiment shown in FIG. 6, the reference voltage $V_{REF}$ is supplied to an inverting input terminal of an operational amplifier (op-amp) 152 (e.g., the reference voltage $V_{REF}$ is supplied by a reference voltage source). The output of the op-amp 152 is connected to the gate of a PMOS transistor 154. A power supply (or voltage source) VDD is supplied to both the op-amp 152 and the source of the PMOS transistor 154. The drain of the PMOS transistor is connected to node N, which is also connected to a non-inverting input terminal of the op-amp 152. In addition, in some embodiments, a capacitor 156 is connected between the power supply VDD and the gate of the PMOS transistor 154 as an optional component for stability compensation. In the embodiment shown in FIG. 6, Miller compensation is not used in order to avoid a high frequency short (e.g., there is no capacitor between the output of the op-amp 152 and the non-inverting input of the op-amp 152).

While some embodiments of a DC current absorber using a voltage follower circuit are depicted in FIG. 6 as op-amp based circuits, embodiments of the present disclosure are not limited thereto and other known and appropriate designs for voltage follower or DC current absorber circuits may be used, such as a low-dropout regulator (LDO) based voltage follower may also be used. In addition, as would be understood by one of skill in the art, the embodiments of the DC current absorber 150 shown and described with respect to FIG. 6 may be used in conjunction with a squaring circuit 110 as shown and described with respect to FIG. 5.

As such, some embodiments of the present disclosure relate to a detector circuit 100 that includes a squaring circuit 110 (e.g., a CMOS squaring circuit) that down-converts LO leakage and image tones at an offset of $f_{BB}$ and $2f_{BB}$ in which odd-harmonics are canceled and a detected signal with second harmonics are supplied to a transimpedance amplifier 26 of a receiver circuit 20, thereby allowing sharing of existing hardware between multiple purposes and reducing the need for additional area on a receiver chip for providing feedback for recalibration of the transceiver 1, such as for detecting LO leakage and I/Q imbalance.

In some embodiments, the DC current absorber 150 provides a low power (e.g., drawing 100 μA at 1 V VDD), area efficient (e.g., without the need large capacitors and/or inductors and by reusing existing components of a receiver circuit) method for removing a DC component of the signal which shows power content and provides an impedance greater than 50 KO for baseband frequency $f_{BB}$ and $2f_{BB}$ components of the output of the squaring circuit 110.

Accordingly, aspects of embodiments of the present disclosure provide systems and methods for detecting local oscillator leakage and image tone in the output of an amplifier (e.g., a power amplifier) of a transmit side of a radio transceiver. Aspects of embodiments of the present disclosure can be implemented in a compact circuit by: reusing portions of a radio receiver 20 of a radio transceiver for detecting the LO leakage and image tone; and by the use of a voltage follower, or other DC current absorber circuit, for substantially removing the radio frequency signal from the output of the detector, without resorting to the use of a large DC blocking capacitor or a large DC bypass inductor. The use of a squaring circuit (e.g., which may include only two transistors) and a simple voltage follower also allows embodiments of the present disclosure to operate at low power (e.g., without the need for additional oscillators or mixers).

While embodiments of the present disclosure have been described in connection with certain exemplary embodiments, it is to be understood that the embodiments of the disclosure are not limited to the disclosed embodiments, but, on the contrary, is intended to cover various modifications and equivalent arrangements included within the spirit and scope of the appended claims, and equivalents thereof.

What is claimed is:

1. A transceiver comprising:
a radio transmitter comprising a power amplifier; and
a detector circuit comprising:
   a squaring circuit configured to receive an output of the power amplifier of the radio transmitter and configured to produce an output current; and
   a DC current absorber electrically connected to an output terminal of the squaring circuit.

2. The transceiver of claim 1, wherein a filtered output of the DC current absorber is supplied to a transimpedance amplifier.

3. The transceiver claim 2, wherein the radio transmitter comprises a transmit mixer configured to mix an output of a transmitter local oscillator with an input baseband signal to produce a transmit mixer output, the transmit mixer output being supplied as input to the power amplifier,
wherein the squaring circuit is configured to produce the output current at an output terminal connected to a radio receiver through a detector switch, the radio receiver comprising:
   the transimpedance amplifier; and
   a receive mixer configured to mix a received signal with a receiver local oscillator, an output of the receive mixer being connected to the transimpedance amplifier through a receiver switch.

4. The transceiver of claim 2, wherein an integrated circuit comprises:
the transceiver comprising:
   the radio transmitter; and
   a radio receiver comprising the transimpedance amplifier; and
the detector circuit.

5. The transceiver of claim 4, further comprising:
a receiver switch connected between a receive mixer of the radio receiver and the transimpedance amplifier, the receiver switch being configured to disconnect the radio receiver during calibration of the transceiver using the detector circuit; and
a detector switch connected between the output terminal of the squaring circuit and the transimpedance amplifier, the detector switch being configured to connect the output terminal of the squaring circuit of the detector circuit to the transimpedance amplifier during calibration of the transceiver.

6. The transceiver of claim 1, wherein the radio transmitter further comprises a transmit mixer configured to mix an output of a transmitter local oscillator with an input baseband signal to produce a mixer output, the mixer output being supplied to the power amplifier.

7. The transceiver of claim 6, wherein a local oscillator leakage tone in the output of the power amplifier corresponds to the output of the transmitter local oscillator.

8. The transceiver of claim 6, wherein a signal path of the transmit mixer comprises an in-phase portion and a quadrature portion, and
wherein an image tone in the output of the power amplifier corresponds to an imbalance between the in-phase portion and the quadrature portion of the signal path.

9. The transceiver of claim 1, wherein the squaring circuit comprises:
a first transistor; and
a second transistor,
the first transistor and the second transistor being connected in parallel between an output terminal of the squaring circuit and ground,
wherein the output of the squaring circuit corresponds to a sum of a first current flowing through the first transistor and a second current flowing through the second transistor in accordance with the output of the power amplifier, where the output of the power amplifier is differentially supplied to a first gate electrode of the first transistor and a second gate electrode of the second transistor.

10. The transceiver of claim 1, wherein the DC current absorber comprises a low-dropout regulator-based voltage follower.

11. The transceiver of claim 1, wherein the DC current absorber comprises:

an operational amplifier having a non-inverting input connected to the output terminal of the squaring circuit and an inverting input connected to a reference voltage source;

a transistor connected between a power supply and the output terminal of the squaring circuit and having a gate electrode connected to an output of the operational amplifier; and a capacitor connected between the power supply and the gate electrode of the transistor.

12. The transceiver claim 1, wherein an output impedance of the DC current absorber is frequency dependent and has a low output impedance at frequencies below a desired cutoff frequency and a high output impedance otherwise.

13. A method comprising:

supplying an output of a power amplifier of a radio transmitter of a radio transceiver to a squaring circuit of a detector circuit of the radio transceiver to generate an output current, the output current of the squaring circuit comprising:

a direct current (DC) component comprising a function of a desired tone of the output of the power amplifier; and an alternating current (AC) component comprising:
a function of a local oscillator leakage tone of the output of the power amplifier; and
a function of an image tone of the output of the power amplifier; and absorbing, by a DC current absorber of the detector circuit, the DC component of the output current to produce a filtered output of the squaring circuit, wherein the filtered output comprises the function of the local oscillator leakage tone and the function of the image tone.

14. The method of claim 13, further comprising supplying the filtered output to a transimpedance amplifier.

15. The method of claim 14, wherein the transimpedance amplifier is a component of a radio receiver of the radio transceiver.

16. The method of claim 15, wherein the radio receiver further comprises a receive mixer configured to mix a received signal with a receiver local oscillator, an output of the receive mixer being connected to the transimpedance amplifier through a receiver switch, wherein the detector circuit comprises an output terminal configured to supply the filtered output to the transimpedance amplifier through a detector switch, and wherein the method further comprises, while detecting local oscillator leakage and image tone of the radio transceiver:
connecting, by the detector switch, the output terminal of the detector circuit to the transimpedance amplifier; and
disconnecting, by the receiver switch, the receive mixer from the transimpedance amplifier.

17. The method of claim 14, further comprising:

mixing, by a transmit mixer of the radio transmitter of the radio transceiver, an input baseband signal with an output of a transmitter local oscillator of the radio transmitter to generate a mixer output; and amplifying, by the power amplifier of the radio transmitter, the mixer output to produce the output of the power amplifier.

18. The method of claim 17, wherein the local oscillator leakage tone corresponds to the output of the transmitter local oscillator.

19. The method of claim 17, wherein a signal path of the transmit mixer comprises an in-phase portion and a quadrature portion, and wherein the image tone corresponds to an imbalance between the in-phase portion and the quadrature portion of the signal path.

20. The method of claim 17, wherein the squaring circuit comprises:

a first transistor; and a second transistor having substantially identical transistor characteristics as the first transistor, the first transistor and the second transistor being connected in parallel between an output terminal of the squaring circuit and ground, wherein the output of the squaring circuit corresponds to a sum of a first current flowing through the first transistor and a second current flowing through the second transistor in accordance with the output of the power amplifier, where the output of the power amplifier is differentially supplied to a first gate electrode of the first transistor and a second gate electrode of the second transistor.

* * * * *